United States Patent
Ho et al.

[11] Patent Number: 6,011,911
[45] Date of Patent: *Jan. 4, 2000

[54] LAYOUT OVERLAP DETECTION WITH SELECTIVE FLATTENING IN COMPUTER IMPLEMENTED INTEGRATED CIRCUIT DESIGN

[75] Inventors: Wai-Yan Ho, Cupertino; Hongbo Tang, San Jose, both of Calif.

[73] Assignee: Synopsys, Inc., Mountain View, Calif.

[*] Notice: This patent is subject to a terminal disclaimer.

[21] Appl. No.: 08/940,162

[22] Filed: Sep. 30, 1997

[51] Int. Cl.⁷ .................................................. G06F 17/50

[52] U.S. Cl. ........................................ 395/500.06

[58] Field of Search .................................. 364/488–491, 364/578; 395/500.02–500.19

[56] References Cited

U.S. PATENT DOCUMENTS

| | | | |
|---|---|---|---|
| 5,050,091 | 9/1991 | Rubin | 349/500.11 |
| 5,281,558 | 1/1994 | Bamji et al. | 395/500.03 |
| 5,528,508 | 6/1996 | Russell et al. | 395/500.09 |
| 5,544,067 | 8/1996 | Rostoker et al. | 395/500.35 |
| 5,604,680 | 2/1997 | Bamji et al. | 395/500.09 |
| 5,625,564 | 4/1997 | Rogoyski | 395/500.02 |
| 5,629,861 | 5/1997 | Kim | 395/500.09 |

OTHER PUBLICATIONS

Nunes et al. ("A new approach to perform circuit verification using O(n) algorithms", IEEE, Proceedings of the 20th EUROMICRO Conference: System Architecture and Integrations, Sep. 5, 1994, pp. 428–432.

Hedenstierna et al. ("The halo algorithm—an algorithm for hierarchical design of rule checkiing of VLSI circuits", IEEE Transactions on Computer–Aided Design of Integrated Circuits and Systems, vol. 12, No. 2, Feb. 1993, pp. 265–272).

Stevens et al. ("An Integrated Approach for Hierarchical Verification of VLSI Mask Artwork", IEEE Journal of Solid–State Circuits, vol. Sc–20, No. 2, Apr. 1985, pp. 501–509.

Hedenstierna et al. ("The use of inverse layout trees for hierarchical design verification", IEEE International Conference on Computer–Aided Design, ICCAD–88, Nov. 7, 1988, pp. 534–537).

(List continued on next page.)

*Primary Examiner*—Kevin J. Teska
*Assistant Examiner*—Phallaka Kik
*Attorney, Agent, or Firm*—Wagner, Murabito & Hao LLP

[57] ABSTRACT

The present invention relates to a method for efficiently performing hierarchical design rules checks (DRC) and layout versus schematic comparison (LVS) on layout areas of an integrated circuit where cells overlap or where a cell and local geometry overlap. With the present invention, a hierarchical tree describes the integrated circuit's layout data including cells having parent-child relationships and including local geometry. The present invention performs efficient layout verification by performing LVS and DRC checking on the new portions of an integrated circuit design and layout areas containing overlapping cells. When instances of cells overlap, the present invention determines the overlap area using predefined data structures that divide each cell into an array of spatial bins. Each bin of a parent is examined to determine if two or more cell instances reside therein or if a cell instance and local geometry reside therein. Once overlap is detected, the areas of the layout data corresponding to the overlap areas are selectively flattened prior to proceeding to DRC and LVS processing. During selective flattening of the overlap areas, the hierarchical tree is traversed from the top cell down through intermediate nodes to the leaf nodes. Each time geometry data is located during the traversal, it is pushes directly to the top cell without being stored in intermediate locations. This provides an effective mechanism for selective flattening.

18 Claims, 14 Drawing Sheets

OTHER PUBLICATIONS

Goering ("Avant! Launches Hercules verification Tool", Electronic Engineering Times, No. 924, p. 100 (1–2), Oct. 21, 1996,.

Martin E. Newell, Daniel T. Fitzpatrick; "Exploiting Structure in Integrated Circuit Design Analysis"; Jan. 26, 1982; Xerox Palo Alto Research Centers and Computer Science Division University of California, Berkeley, 1982 Conference on Advanced Research in VLSI, M.I.T., PP. 84–92.

| xb3 | xb7 | xb11 | xb15 | xb19 | ← 810
|-----|-----|------|------|------|
| xb2 | xb6 | xb10 | xb14 | xb18 |
| xb1 | xb5 | xb9  | xb13 | xb17 |
| xb0 | xb4 | xb8  | xb12 | xb16 |

FIG. 8A

| yb4 | yb9 | yb14 | yb19 | yb24 | ← 820
|-----|-----|------|------|------|
| yb3 | yb8 | yb13 | yb18 | yb23 |
| yb2 | yb7 | yb12 | yb17 | yb22 |
| yb1 | yb6 | yb11 | yb16 | yb21 |
| yb0 | yb5 | yb10 | yb15 | yb20 |

FIG. 8B

Legend

| | | |
|---|---|---|
| 1a = xb11 | 1g = xb10 | 1m = yb4 |
| 1b = xb15 | 1h = xb14 | 1n = yb5 |
| 1c = xb19 | 1i = xb18 | 1o = yb10 |
| 1d = yb1 | 1j = yb0 | 1p = xb12 |
| 1e = yb6 | 1k = yb2 | 1q = xb13 |
| 1f = yb11 | 1l = yb3 | 1r = xb16 |
| | | 1s = xb17 |

LAYOUT OVERLAP DETECTION WITH SELECTIVE FLATTENING IN COMPUTER IMPLEMENTED INTEGRATED CIRCUIT DESIGN

BACKGROUND OF THE INVENTION

1. Field of the Invention

The present invention relates to layout verification for an integrated circuit device. More particularly, the present invention relates to a method for improving the process of design rule and layout versus schematic verification for integrated circuit devices.

2. Prior Art

In the design of an integrated circuit, a designer develops a high level language (e.g., VHDL) design and converts this into a netlist using circuit synthesis or logic capture computer implemented programs. The netlist represents logic elements and their interconnections that perform the desired circuit functions outlined in the high level circuit design. Using the netlist, a circuit layout is developed that translates the electrical symbols and connections into primitive geometric patterns ("primitives or geometry") from which transistors or other logic elements are formed and which are to be etched onto the semiconductor device.

The various primitives specify various geometric objects such as boxes, polygons, vias and wires. Cells are defined as either a geometric primitive, such as a single polygon, or as a combination of a plurality of primitives arranged to create a device, such as a transistor or a number of transistors. Since cells are respectively used in the design of an integrated device, it is convenient to identify each cell with a symbolic name that is easily manipulated on a computer. Each instance of this symbolic descriptor used in a circuit is then assembled into a sequence and format suitable for eventual output to a mask-making device or a direct-write-to-silicon semiconductor processing equipment. The sequential stream of symbolic descriptors are typically stored in a data storage device of a computer system and manipulated by computer-based processes to determine where each cell is to be placed on the integrated circuit and the interconnection between the cells. The sequential stream of symbolic descriptors is often called "layout data." One such format for storing and transferring this layout data is the GDSII format (graphic design stream). Layout data can be stored in hierarchical formats where parent cells can incorporate multiple child cells by referencing those cells.

It will be appreciated by one skilled in the art that as cells are assembled in a hierarchical manner by computer-based processes to build subsystems, and as subsystems are interconnected in a hierarchical manner to implement desired circuit functions, it is common for one or more layout design rules to be violated. Design rules specify permissible geometric patterns, minimum resolution, spacing between cells and other constraints of the integrated circuit manufacturing process that need be followed for proper operation of the devices and interconnections formed by the process. Although design rule violations may not necessarily result in a non-functional integrated circuit, production yields may be negatively impacted with a corresponding increase in the cost of manufacture or other circuit problems can result.

Design rule checking procedures (DRCs) and layout versus schematic (LVS) checking are executed on the layout data to determine if any violations exist on an integrated circuit layout design. It is desirable to arrive at a layout design that contains no design rule violations in before the design is committed to silicon or other semiconductor material. The LVS procedures compare the layout data to the actual logic elements of an integrated circuit design's netlist to determine if the layout data actually performs the proper logic functions as specified in the netlist. Violations occur where this mapping is faulty. It is desirable to arrive at a layout design that contains no LVS violations in before the design is committed to silicon or other semiconductor material.

Design rules may be checked either manually or by interpreting the symbolic stream with computer programs once the layout of an integrated circuit is available. In the past, DRC and LVS verification required the entire hierarchical representation, often referred to as the hierarchical tree, of the integrated circuit be processed entirely for each layout verification. The data can be processed using a flatten process or a hierarchical process. Under the flatten process, the design is completely flattened into the top level cell so as to remove all hierarchical structure. The flat representation is created by moving the geometry of leaf cells, e.g., those cells at the lowest level of the hierarchical tree, and the geometry of all intermediate cells, upward through the hierarchical structure until all layout data and interconnect information resides at the top level. The flat representation is then run through DRC and LVS checking. Each time an integrated circuit design is modified, it needs to be entirely flattened and entirely re-run through DRC and LVS checking procedures.

Using a hierarchical approach, the process is not entirely flattened but processed according to the hierarchical tree. However, even under this approach, each time an integrated circuit design is modified, it needs to be re-run through DRC and LVS checking procedures. However, performing DRC and LVS checking on a densely populated circuit (as performed by flat DRC programs) is memory and input/output (I/O) intensive and relatively inefficient in terms of computer processing time since each instance of a cell must be checked for conformity with the layout verification rules. In fact, layout verification programs can often take many hours to perform on high density integrated circuits. It would be advantageous to provide a layout verification system that can operate only on a portion of the design.

One problem with DRC and LVS checkers arises when the processes encounter juxtaposed cells. Overlap of adjacent cells can introduce layout errors not present in either cell prior to the overlap or can remove apparent errors that exist in the absence of the overlap. Early prior art methodologies prohibited overlap as a means to prevent unanticipated parasitic devices from being created by the overlap of cells. But merely prohibiting overlap of cells is not acceptable since circuit design requires that cells overlap to create, for example, full width conductors, inputs and outputs to the cell or to reduce the size of routing resources.

One improved hierarchical method for checking for design rules violations created by overlap areas is disclosed in *Exploiting Structure in Integrated Circuit Design Analysis* by Martin E, Newell and Daniel T. Fitzpatrick, 1982 Conference on Advanced Research in VLSI, M.I.T., Jan. 26, 1982, p. 84. The disclosed method employs a disjoint transformation to exploit the hierarchical nature of the typical integrated circuit design. The disjoint transformation removes overlapping cell instances by generating new cells from the overlapping area of these cells. The new cells are generated by recursively employing "split" and "gather" procedures. However, this method is inefficient since new must be cells created and design rule checks performed on each of the new cells. Further, the time to perform the disjoint transformation depends in large part on the degree of overlap present in the circuit and is not necessarily correlated with the number of transistors comprising the design.

Recognizing that greater efficiency could be achieved, later design rule checking methods check each cell in its environmental context by first identifying all elements that interact with the cell. On such method is disclosed in *The Halo Algorithm—An Algorithm for Hierarchical Design of Rule Checking of VLSI Circuits*, Nils Hedenstierna and Kjell O. Jeppson, IEEE Transaction On Computer-Aided Design of Integrated Circuits and Systems, Vol. 12, No. 2, February 1993. This reference discloses a hierarchical checking algorithm where each cell is checked in context of the environment in which the cell is used. One primarily purpose of this algorithm is to solve the problem of where to report a design rule violation (i.e., whether to include violations with the cell description as stored in the database structure or as part of all chip level instances of that cell).

This algorithm first generates a hierarchical tree to describe chip-level instances of cells hierarchically. The tree consists of all paths from the chip level instance to the most primitive cells, often referred to as instances of leaf cells. After generating the hierarchical tree, an inverse layout tree is derived for each leaf cell. The inverse layout tree is derived by treating the leaf cell as the root and taking all paths from the leaf cell to the chip-level. If the circuit design is regular, the inverse layout tree may be simplified to minimize memory requirements and will process faster. However, since multiple inverse trees must be derived, processing time and memory are increased. Further, it is not desirable to build and store inverse layout trees each time the circuit is modified. Inverse hierarchical trees do not represent the natural order in which hierarchical database information is stored in a layout file. Further still, it is not desirable to expend time or system resources in building large intermediate data structures.

Further, the above-described DRC and LVS checking processes are lengthy to perform and must be performed each time the design of the circuit is modified, even if the modification is relatively minor or isolated. Clearly, the prior art processes are inefficient particularly when DRC and LVS processes must be re-run on moderately or only slightly modified layout database information.

Accordingly, it is desirable to provide a method for verifying circuit layout of an integrated circuit, (e.g., performing design rule checks and/or LVS checks) while reducing demand on computer resources and time to complete the verification. The present invention offers the above by allowing layout verification only on a portion of the layout data. Further, it is desirable that the method provide an efficient means for detecting and checking overlapping geometric features to eliminate circuit errors. It is also desirable to perform efficient methods for flattening the layout data in those overlapping areas. The present invention provides the above advantages and other not specifically recited above but clear within the discussions of the present invention presented herein.

SUMMARY OF THE INVENTION

The present invention relates to a layout verification method particularly useful for verification of integrated circuit devices that are densely populated with logic elements. Specifically, the present invention relates to a method for efficiently performing hierarchical design rules checks (DRC) and layout versus schematic (LVS) checks by identifying certain regions of the layout having overlapping designs positioned therein and further selectively flattening the layout database only for those identified overlapping areas. Only this portion of the design is then passed through DRC and LVS checks.

With the present invention, a hierarchical tree describes device-level instances of cells where the top-most cell of the tree fully describes the layout of the device by containing layout geometry and/or by referencing child cells that describe or reference other geometry. The hierarchical tree is derived from an attribute file that is in turn derived from a high level descriptive. The hierarchical tree establishes a parent-child relationship between cells together with information regarding the location and orientation of the cells on the integrated circuit substrate. Design rules verification and layout versus schematic analysis is performed on layout data to identify whether the integrated circuit contains improper geometry or violates any design constraint.

Upon subsequent layout verification processes on an integrated circuit design that has already been verified at least once before, the present invention advantageously identifies those portions of the integrated circuit design that are new from the prior verification. These new portions are re-verified and the DRC and LVS checking procedures of the present invention ignore the remainder (e.g., old and unchanged portions) of the layout database. In this process, the present invention provides a mechanism for identifying those portions of the layout data that contain overlapping cells or areas that contain one cell with overlapping local geometry. This overlap area is also re-verified by DRC and LVS checking.

Overlap is detected by associating each instance of a cell with a top-level (e.g. parent cell) bin array representing the topological view of the integrated circuit. Each instance of a cell, its location and orientation known, is tagged with a local bin number. If two or more instances of cells share common bin numbers from their parent cell, then those parent bins have overlap. If an instance within a bin of its parent cell shares local geometry also of the parent bin, then an overlap is detected.

Once overlap is detected, it is necessary to determine whether the layout geometry of the cells that exist within the overlap areas violate the design rules or layout versus schematic checking. However, since each instance is separately retained in the database, it is necessary to combine the overlapping instances prior to performing the verification. In the present invention, the hierarchical description is selectively flattened from the top of the tree starting from the top of an overlap bin and proceeding downward to the leaf cells within the overlap bin. From the top down through the intermediary cells to the bottom, each time geometry is located it is directly stored in the top level without being stored in any intermediate cell memory location. The flattened portions are then forwarded to the DRC and LVS checking procedures.

BRIEF DESCRIPTION OF THE DRAWINGS

FIG. 8A illustrates one exemplary child cell having bins defined therein in accordance with the present invention.

FIG. 8B illustrates a second exemplary child cell having bins defined therein in accordance with the present invention.

DETAILED DESCRIPTON OF THE INVENTION

Figure 1:
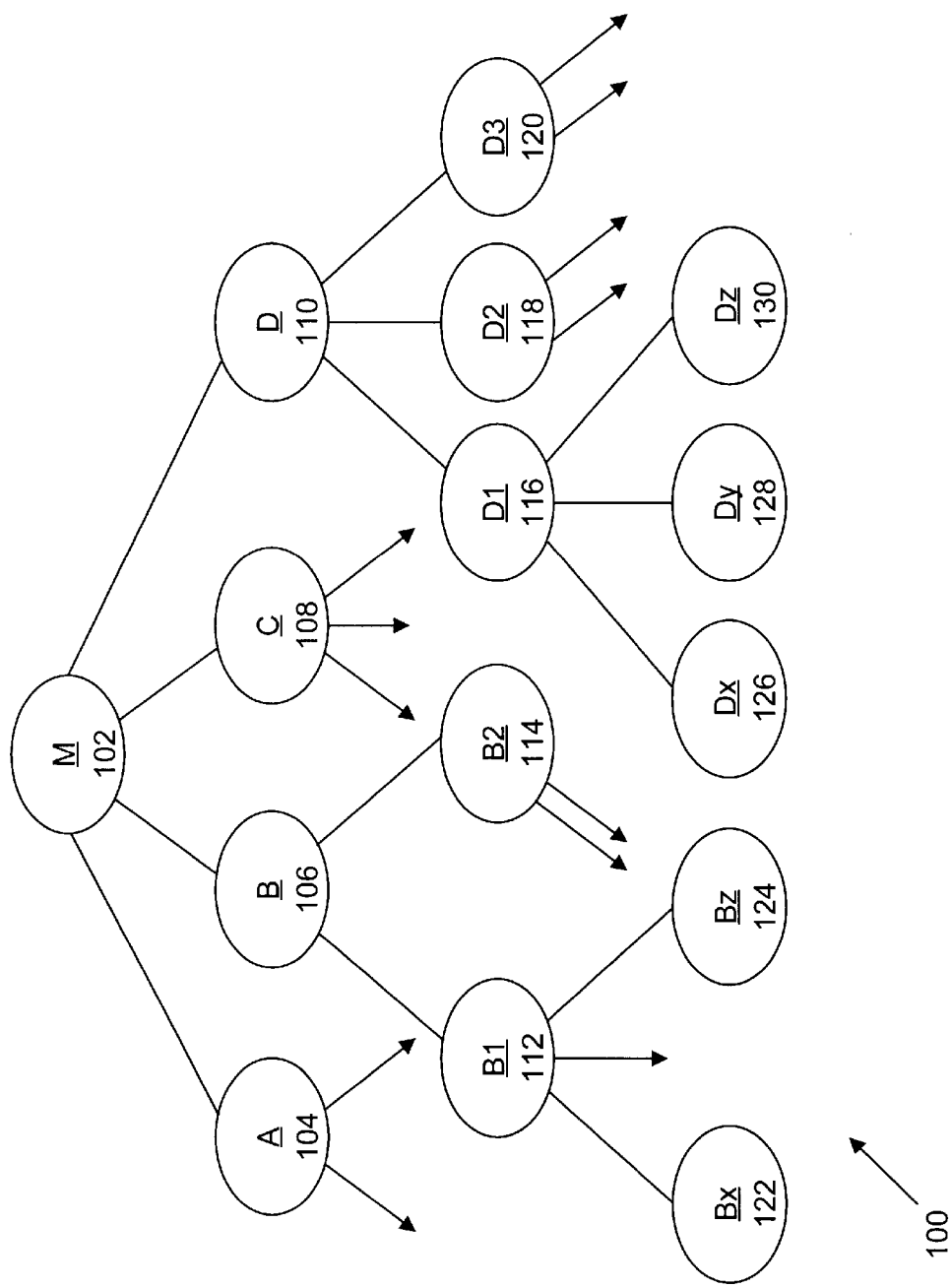
FIG. 1 illustrates a hierarchical tree showing the relationship between a plurality of cells having parent-child relationships that describe the layout of an integrated circuit.

In the following description of the preferred embodiment, reference is made to the accompanying drawings which form a part hereof, and in which is shown by way of illustration a specific embodiment in which the invention may be practiced. It is to be understood that other embodiments may be utilized and that changes may be made without departing from the scope of the present invention. For purposes of illustration the following description describes the present invention as used in the design of CMOS integrated circuits. It is contemplated, however, that the present invention can be used in the design and manufacture of bi-polar or SOS integrated circuits or integrated circuits manufactured using any other semiconductor process. It is further contemplated that the method of the present will be carried out using a computer system having a CPU, memory, secondary storage devices, displays and human interface means, a workstation or a similar machine capable of manipulating symbolic logical circuit descriptions and geometric primitives.

NOTATION AND NOMENCLATURE

Some portions of the detailed descriptions which follow are presented in terms of procedures, steps, logic blocks, processing, and other symbolic representations of operations on data bits within a computer memory, e.g., processes 300, 400, 406 and 408. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM 1212

Figure 12:
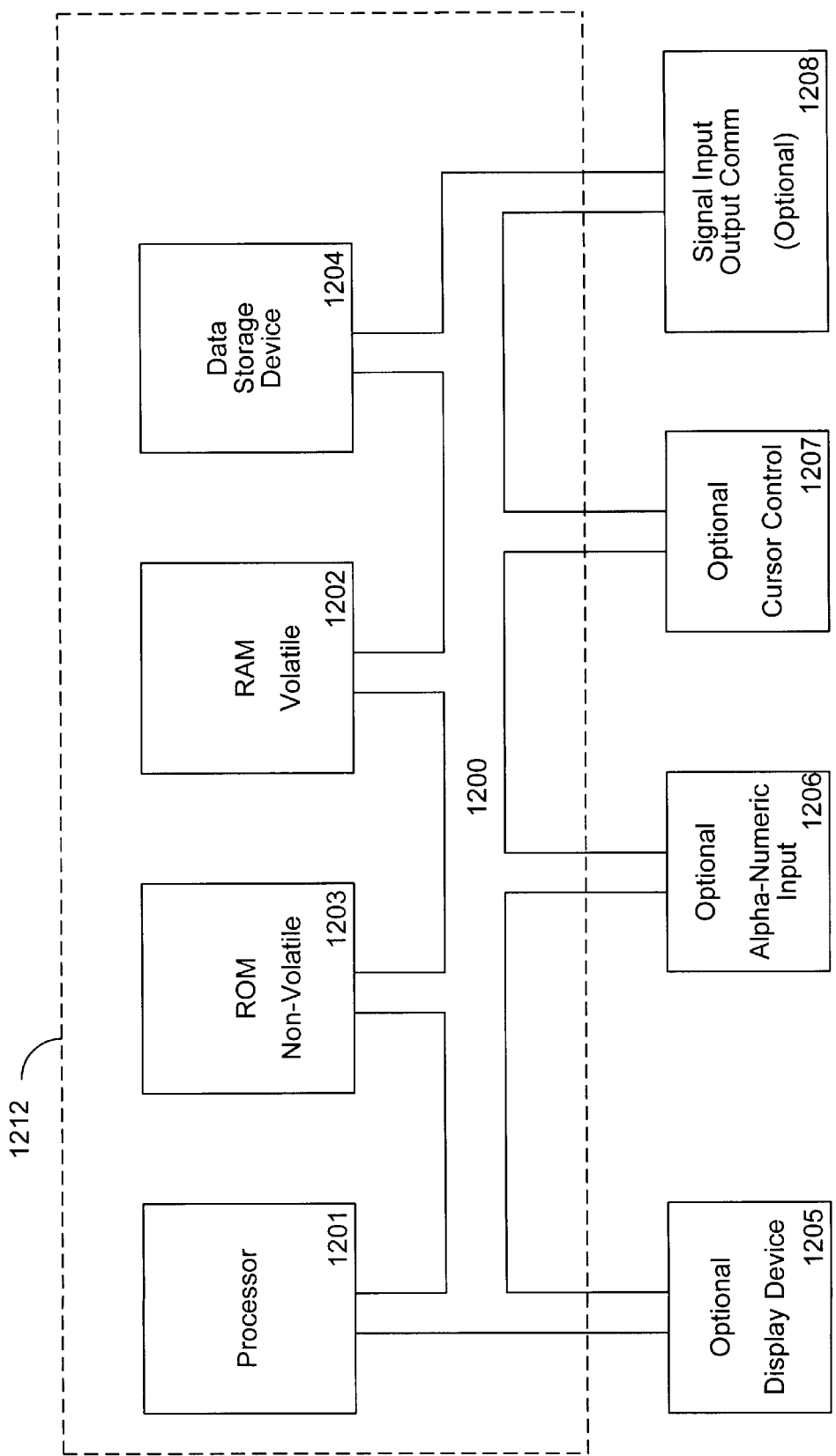
FIG. 12 is a computer system on which embodiments of the present invention can be implemented.

With reference to the layout verification system and particularly to the overlap determination and selective flattening procedures thereof, several aspects are described in terms of steps executed on a computer system. Although a variety of different computer systems can be used with the present invention, an exemplary computer system 1212 is shown in FIG. 12. In general, computer systems 1212 that can be used by the present invention comprise an address/data bus 1200 for communicating information, a central processor 1201 coupled with the bus for processing information and instructions, a volatile memory 1202 (e.g., random access memory) coupled with the bus 1200 for storing information and instructions for the central processor 1201, a non-volatile memory 1203 (e.g., read only memory) coupled with the bus 1200 for storing static information and instructions for the processor 1201, a data storage device 1204 such as a magnetic or optical disk and disk drive coupled with the bus 1200 for storing information and instructions, a display device 1205 coupled to the bus 1200 for displaying information to the computer user, an optional alphanumeric input device 1206 including alphanumeric and function keys coupled to the bus 1200 for communicating information and command selections to the central processor 1201, an optional cursor control device 1207 coupled to the bus for communicating user input information and command selections to the central processor 1201, and a signal generating device 1208 coupled to the bus 1200 for interfacing with other networked computer systems.

The display device 1205 of FIG. 12 utilized with the computer system 1212 of the present invention may be a liquid crystal device, cathode ray tube, or other display device suitable for creating graphic images and alphanumeric characters.

OVERLAPS IN LAYOUT DESIGNS

Reference will now be made in detail to the preferred embodiments of the invention, examples of which are illustrated in the accompanying drawings. As is well known in the art of design and manufacture of integrated circuit devices, a structured approach to design has been a critical factor in the manufacture of dense integrated circuits having over 250,000 transistors. As illustrated in FIG. 1, the hierarchical approach to layout of dense circuits generally requires that a hierarchical map or tree-like structure 100 be generated showing the relationship between the many cells that comprise the layout data for an integrated circuit. The cells include parent-child relationships where parent cells (e.g., cell M) references, and thereby includes, the geometry or further referenced geometry of the child cells (e.g., A, B, C and D).

Each of the cells can comprise geometric primitives and/or references that include other cells. The geometry primitives of a particular cell are called its "local geometry." Therefore, a cell can contain local geometry and/or a reference to one or more child cells. The entire layout of an integrated circuit being represented at a top level 102 of tree 100 which includes all other child cells and their incorporated cells. The top level 102, in this embodiment, comprises cells 104, 106, 108 and 110. For purposes of illustration, only cells 106 and 110 are illustrated as comprising additional cells 112–120 although it should be understood that cells 104 and 108 can also comprise additional cells as indicated by the arrows radiating therefrom. Similarly, cell 112 is shown comprising leaf cells 122–124 while cell 116 is shown comprising leaf cells 126–130. Although not specifically illustrated, cells 114, 118 and 120 may further comprise leaf cells. Each leaf cell, e.g., the lowest level of a branch of the tree, comprises primitive geometric elements that define layout patterns (geometry) which can include one or more of the following: diffusion areas, polysilicon patterns, vias, metal connectors and/or other user-defined sub-cells.

At the top cell 102, the relationship between the layout data is developed as a composite representation. However, the process of combining myriad cells to represent the layout data of the top cell 102 representation can generate geometric patterns that violate applicable design rules that were not apparent from an inspection of cell levels, separately, that are located below the top level 102 or at one or more intermediate levels. In other words, although each of the child cells 104-130 may properly pass DRC and LVS checking procedures, the layout composite as represented in top cell 102 can nevertheless fail layout verification due to the manner in which the geometry of the child cells interface and overlap with one another. Therefore, to properly perform layout verification on the integrated circuit layout data, as represented in hierarchical tree 100, the present invention determines those layout areas in which cell designs overlap with each other. Further, the present invention also determines those layout areas in which a cell design overlaps with local geometry of its parent cell.

Figure 2:
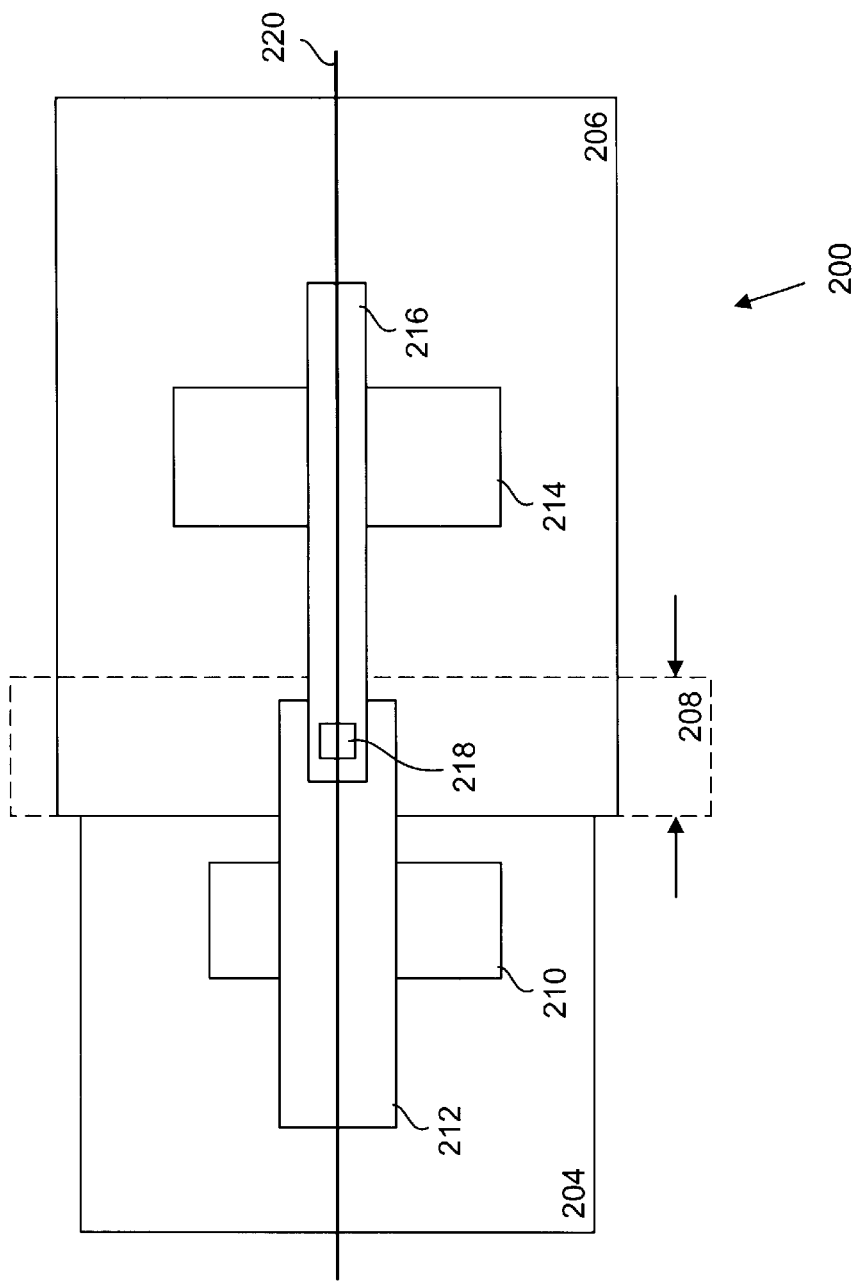
FIG. 2 illustrates schematic representations of two overlapping cells.

Referring now to FIG. 2, it is common for instance of cells to overlap such as shown where cell instance 204 overlaps instance 206 to create overlap area 208. There are a number of reasons to explain instance cell overlap. Intentional overlap of cell instances minimizes the surface area of integrated circuit, reduces interconnect length between cell instances and/or is used as a mechanism for creating desired circuit structures (e.g. a full-width power bus) or logic elements. Herein, a cell refers to a combination of the geometric primitives of the design portion together with placement and orientation information of the geometry of the cell. A cell can be replicated many times within an integrated circuit. Therefore, an "instance" of a cell refers to a particular copy that has been placed within the integrated circuit layout design at a particular physical location.

In FIG. 2, instance 204 comprises a diffusion area 210 and an overlying polysilicon stripe 212 thereby forming a transistor. Instance 206 comprises a diffusion area 214 and poly stripe 216. By overlapping instances 204 and 206, poly stripes 212 and 216 become electrically connected in overlap area 208 to form parallel transistor gates. By adding a third instance comprising via 218, it is possible to electrically connect the gates to a metal signal line 220. Without the overlap area, two via cells would be required and additional area would be required to complete the circuit connections.

Assuming instances 204, 206 and via instance 218 of FIG. 2 separately pass layout verification, the present invention also determines the layout overlap portion 208, flattens the layout geometry of the overlap portion 208, and sends this partially flattened layout data through DRC and LVS checking. Instances 204, 206 and via instance 218, having been previously verified would not require re-checking but for the introduction of overlap 208. Accordingly, it is necessary, to verify the overlap 208 to ensure that the instances continue to meet all applicable design rules and that no error has been introduced as a result of the overlap. If design rule or LVS violations are identified, they can be eliminated before committing the design to silicon.

Although overlap 208 creates many advantages and may be necessary to properly layout the circuit, the overlap increases the complexity in verifying that the layout design does not violate layout rules. The complexity arises due to the hierarchical tree-like structure (such as shown in FIG. 1) of the layout design where the geometry of a plurality of instances are pieced together only when the entire tree is flattened. The complexity is manifested in the amount of redundancy introduced during the DRC and LVS processes since each instance must be checked in its first instance and then re-checked each time it subsequently occurs once the tree is flattened. The present invention advantageously handles the above problems by only selectively flattening the hierarchical tree 100 for those geometry involved in the overlaps.

Figure 9:
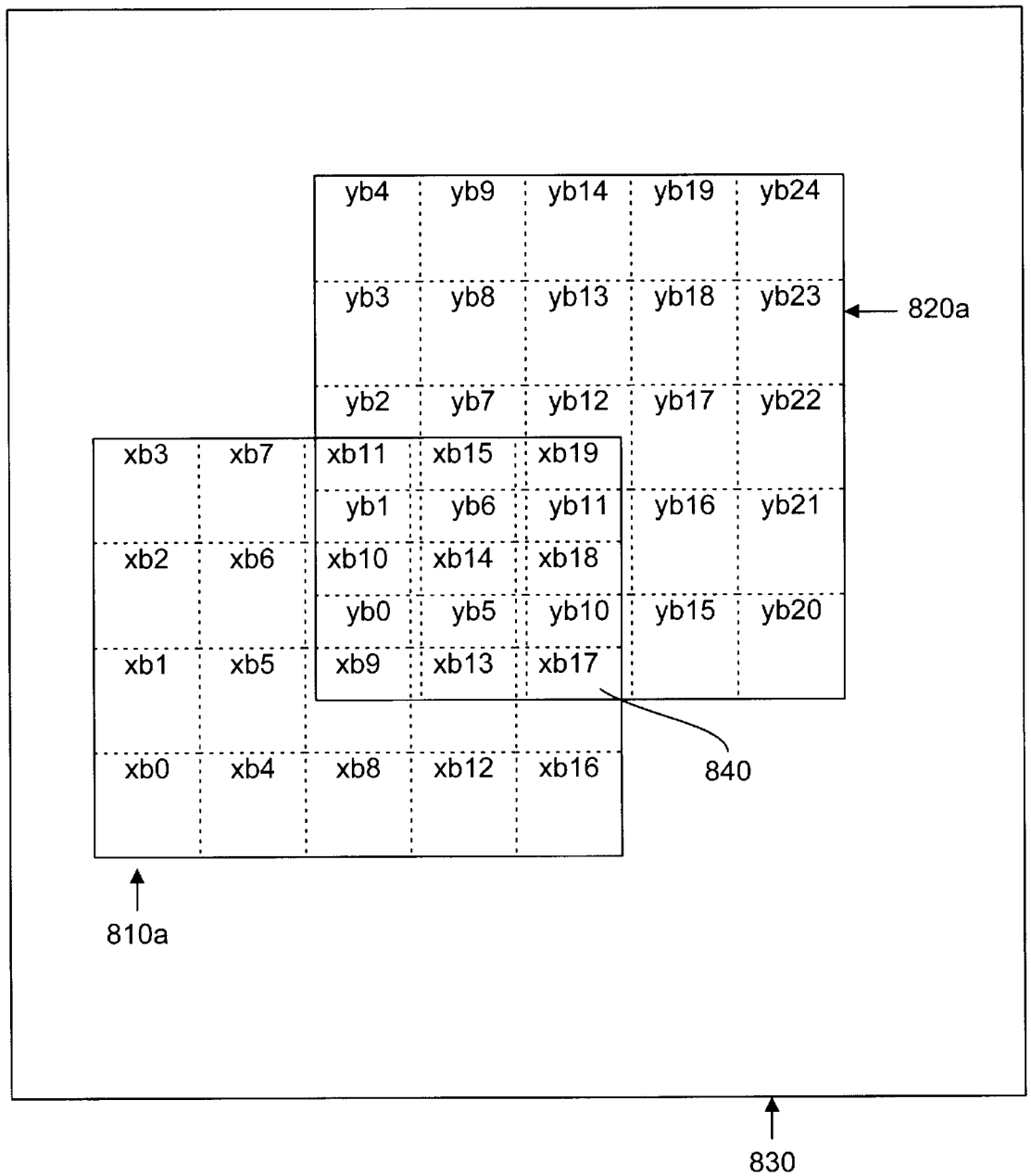
FIG. 9 illustrates the exemplary cells of FIG. 8A and FIG. 8B having a layout overlap.

FIG. 8A, FIG. 8B, FIG. 9 and FIG. 10 illustrate another overlap example. FIG. 8A and FIG. 8B illustrate two separate cells 810 and 820, respectively. Each of the cells are divided into an array of bins. The size of a bin is variable, but in one embodiment is on the order of 10–20 microns square. A cell can be divided into different numbers of bins. For instance, cell 810 is divided into bins xb0–xb19 (20 bins) while cell 820 is divided into bins yb0–yb24 (25 bins). FIG. 9 illustrates an instance 810a of cell 810 and an instance 820a of cell 820. Instance 810a and instance 820a are overlapping each other within a parent cell 830 which incorporates each instance. The overlap area being 840.

Figure 10:
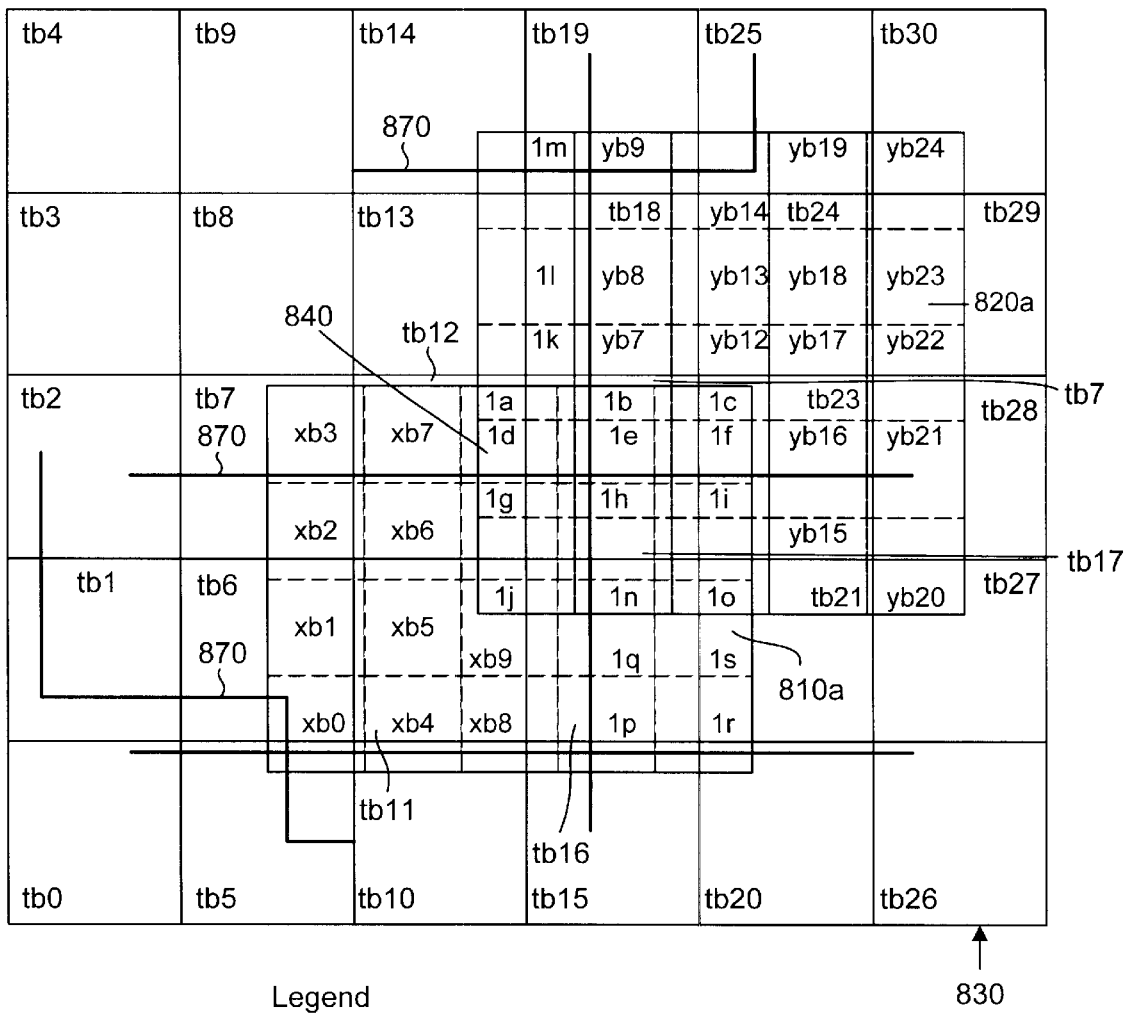
FIG. 10 illustrates the exemplary cells of FIG. 8A and FIG. 8B having a layout overlap within a parent cell that also contains its own local geometry.

FIG. 10 illustrates the same situation as FIG. 9, except local geometry 870 of the parent cell 830 is added and also the bins tb0–tb30 of the parent cell 830 are shown. With reference to FIG. 10, an overlap occurs within a parent bin of bins tb0–tb30 whenever bins of two or more instances reside therein or when local geometry of the parent bin resides within a bin or bins of one or more cell instances. For instance, there is overlap in parent bins tb28, tb25, tb6, etc. There is no overlap in parent bins tb26, tb1, etc. Assuming cells 810 and 820 pass DRC and LVS checking when considered separately, the present invention also checks all overlapping areas within parent cell 830 that involve instances of these cells.

THE LAYOUT VERIFICATION PROCESS

As more fully described disclosed in commonly assigned U.S. patent application, Ser. No. 08/941,145 filed on Sep. 30, 1997, entitled "METHOD AND SYSTEM FOR LAYOUT VERIFICATION OF AN INTEGRATED CIRCUIT DESIGN WITH REUSABLE SUBDESIGNS," by Ho and Tang, attorney docket SNSY-A1997-035, assigned to the assignee of the present invention, the disclosure of which is hereby incorporated herein by reference, conversion of a circuit schematic to an actual layout data of the integrated circuit requires many steps to create. This companion patent application describes the process of converting GDSII (Graphic Design Stream format) file description to a physical netlist. One skilled in the art will appreciate that such steps include preprocessing the high level circuit description to create a polygon database and a hierarchical tree so as to identify each instance together with the relationship between the instances. The steps may further include performing a hierarchical check to detect overlap regions and performing DRC and LVS on flattened overlap regions in a manner described more fully herein.

Figure 3:
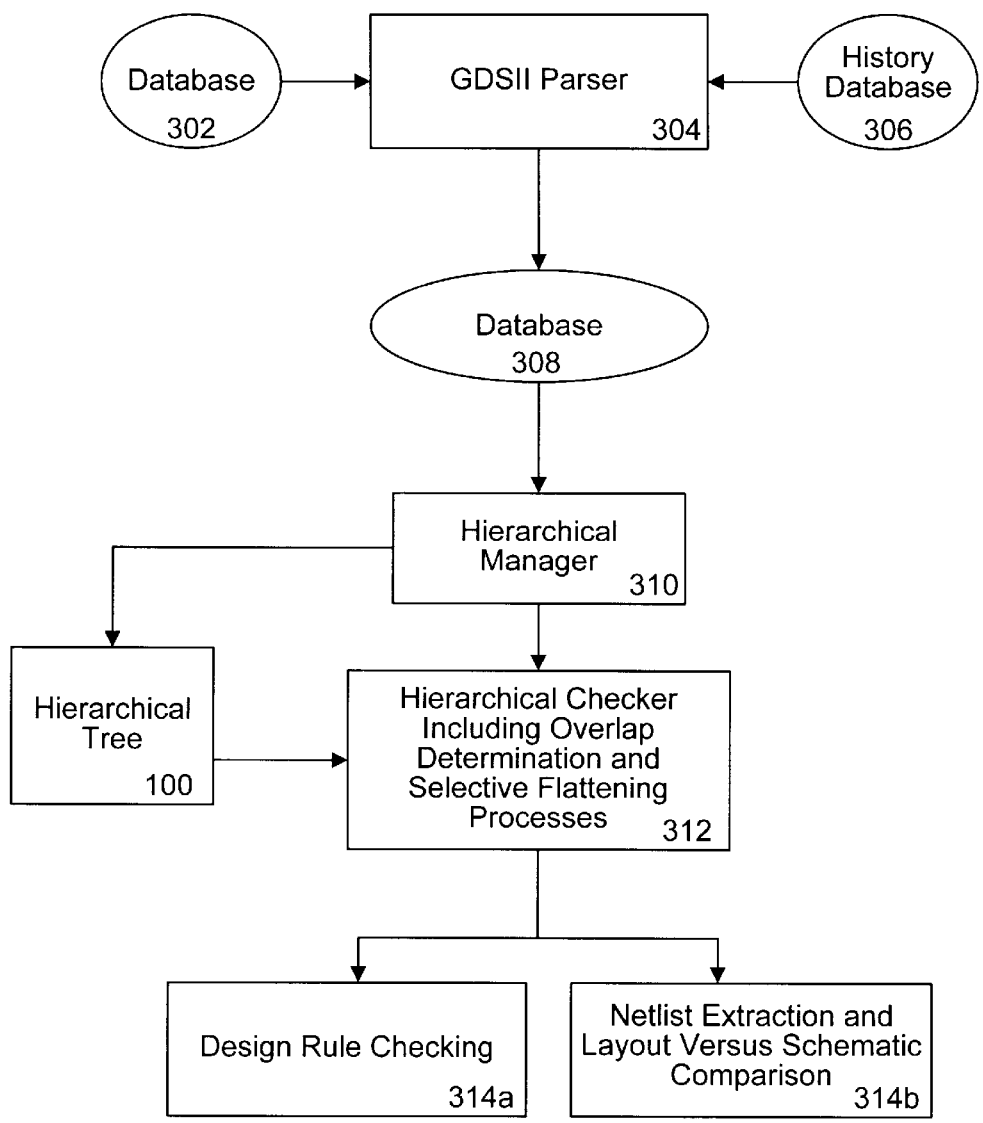
FIG. 3 illustrates a process flow sequence for performing design rule and layout versus schematic checking on layout data of an integrated circuit.

FIG. 3 illustrates an data flow diagram of the process 300 for layout verification in accordance with the present invention. Referring now to FIG. 3, the process 300 to generate the physical netlist for a circuit requires that the layout system generate a GDSII stream descriptive of the circuit geometry which is at least initially stored in polygon database 302. The stream is then parsed by the parsing engine 304 using history polygon database 306 and stored in a composite polygon database 308. Hierarchical manager 310 uses the description stored in database 306 to generate the hierarchical tree 100 of FIG. 1.

More particularly, hierarchical manager 310 of FIG. 3 collects all file paths and develops a hierarchical data structure that provides the parent-child relationships between all instances of an integrated circuit design. The phrase "parent-child" refers to combination of instances where a top or intermediate instance includes by reference two or more child cells or sub-cells. For example, the GDSII stream comprises a series of cells such as:

A→B→C→D where the symbol "→" indicates that parent cell "A" links to cells "B" and "C" and "D" respectively. As indicated in FIG. 1, cells "B" and "C" and "D" may each comprise lower level (e.g., child) cells. For example, where parent cell "B" is made up of leaf cells "E", "F" and "G," the linked list establishes the following relationship down one branch of the hierarchical tree 100:

A→E→F→G

Hierarchical manager 310 maximizes storage efficiency by eliminating excessive copying and storage of multiple copies of the actual geometric description of the linked instances since only the basic cell geometry and the hierarchical data structure 100 are stored.

The hierarchical checker 312 uses the hierarchical tree data structure 100 and the definitions of each individual cell to construct a table of linked lists. Within the table of linked lists, each bin of each cell has an entry. The table of linked lists is used by hierarchical checker 312 to identify whether two or more instances of cells overlap or if a cell instance overlaps with local geometry within the parent cell. In the event two or more instances are found to overlap, the overlapping regions are selectively flattened by process 312, prior to performing the DRC 314a and LVS 314b checking. The flattened overlap areas, once determined, are stored in an overlap database and fed to the DRC 314a and LVS 314b checkers. The processes of DRC 314a and LVS 314b checking, along with netlist extraction are described in more detail in the above referenced patent application.

OVERLAP DETECTION IN LAYOUT VERIFICATION

Figure 4A:
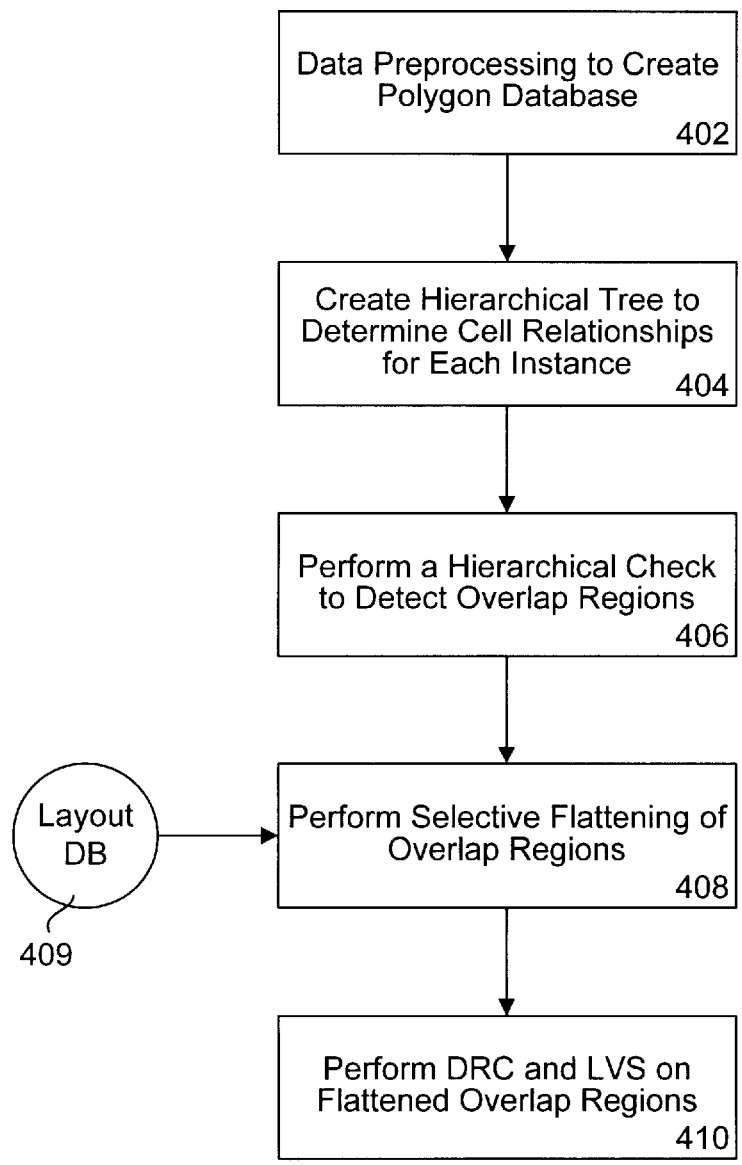
FIG. 4A illustrates one preferred process flow sequence for detecting cell overlap and for selectively flattening overlapping cells.

FIG. 4A illustrates one process 400 for detecting instance overlap or overlap created by routing of local geometry with a cell instance. As will be understood, local geometry is typically the metal conductors that are used to electrically connect each instance of a cell to the other cells. After overlap is detected, process 400 provides for selectively flattening the overlap regions and, in certain cases, running the DRC 314a and LVS 314b checking processes on each flattened region rather than on entire cells which created the overlap.

FIG. 10 illustrates an exemplary parent cell 830 having two overlapping cell instances 810a and 820b. The overlapping region between the instances is marked as region 840. The parent cell 830 is divided into an array of bins marked tb0–tb30. Overlap regions of parent cell 830 also includes those areas in which a cell instance overlaps with the local geometry 870 of the parent cell. Therefore, overlap is detected by the present invention within a bin having (1) local cell geometry and bins of one or more cell instances or (2) bins of two or more cell instances. For instance, parent bin tb6 contains both local geometry 870 and local bins of cell instance 810a. This parent bin tb6 is an overlap area. Secondly, parent bin tb7 contains local bins of cell instance 810a and cell instance 820a and is therefore an overlap area.

Specifically, as indicated at step 402 of FIG. 4A, a polygon (layout) database is created containing the cells of the integrated circuit. As more fully described in the above-referenced companion patent application, the processing steps include updating the database cells to be utilized and format checking as the GDSII file is converted to a polygon description and stored in database 306.

As indicated in step 404, hierarchical manager 310 (FIG. 3) creates hierarchical tree 100 (FIG. 1) and generates a linked list of cell pointers identifying the parent-child relationships of the instances comprising each instance of the circuit description. The hierarchical manager 310 performs a hierarchical check in step 406 to detect overlapping regions of instances of cells.

Once the overlap regions are identified, hierarchical checker 312 (FIG. 3) performs a selective flattening of the overlapping regions as indicated in step 408. The layout geometry associated with the flattened overlap regions is collected in the layout database 409. The layout geometry associated with the flattened overlap regions is then passed from database 409 to the DRC and LVS checkers 314a–314b (FIG. 3) to determine if any design rules are violated by the description of the circuit in the flattened region as indicated in step 410 of FIG. 4A.

Figure 5:
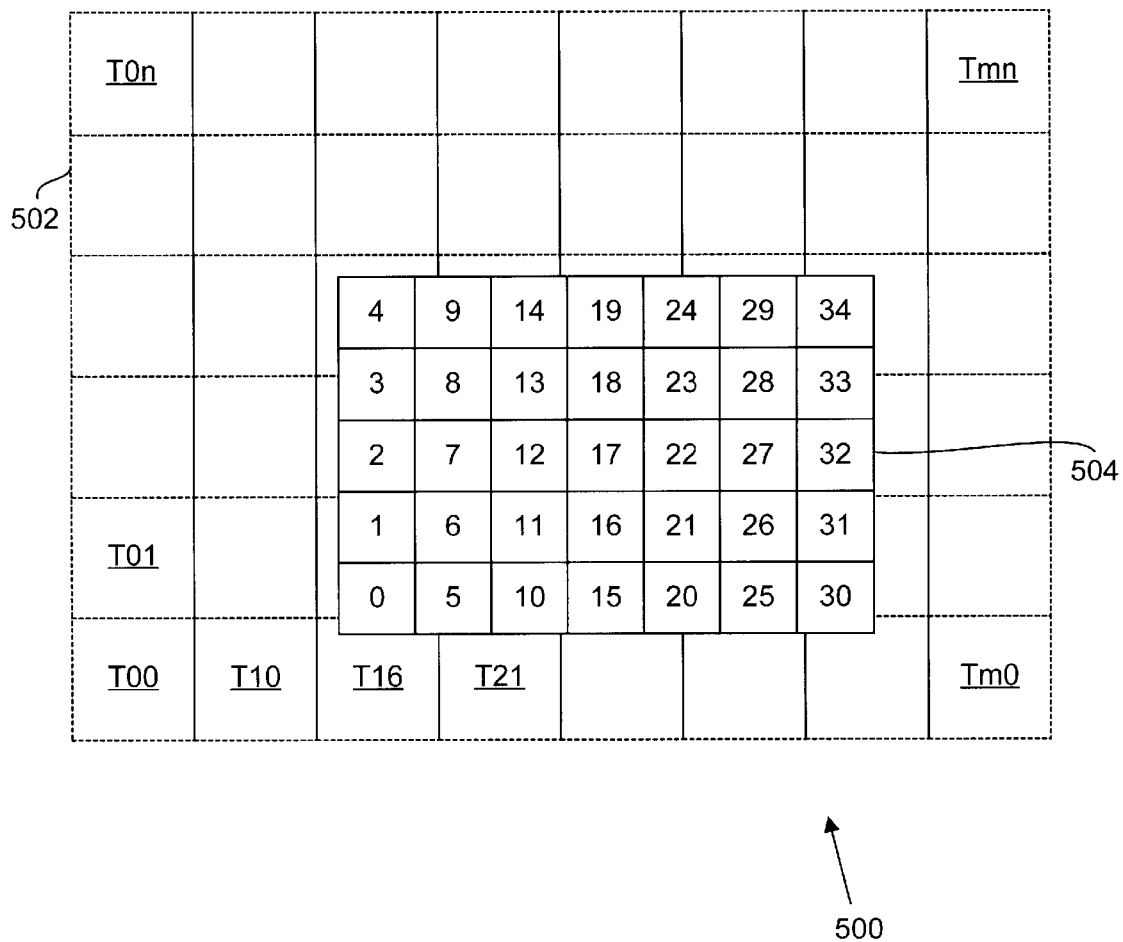
FIG. 5 shows a top-level view of an array of bins that define the topological area of the integrated circuit described by hierarchical tree of FIG. 1.
Figure 6:
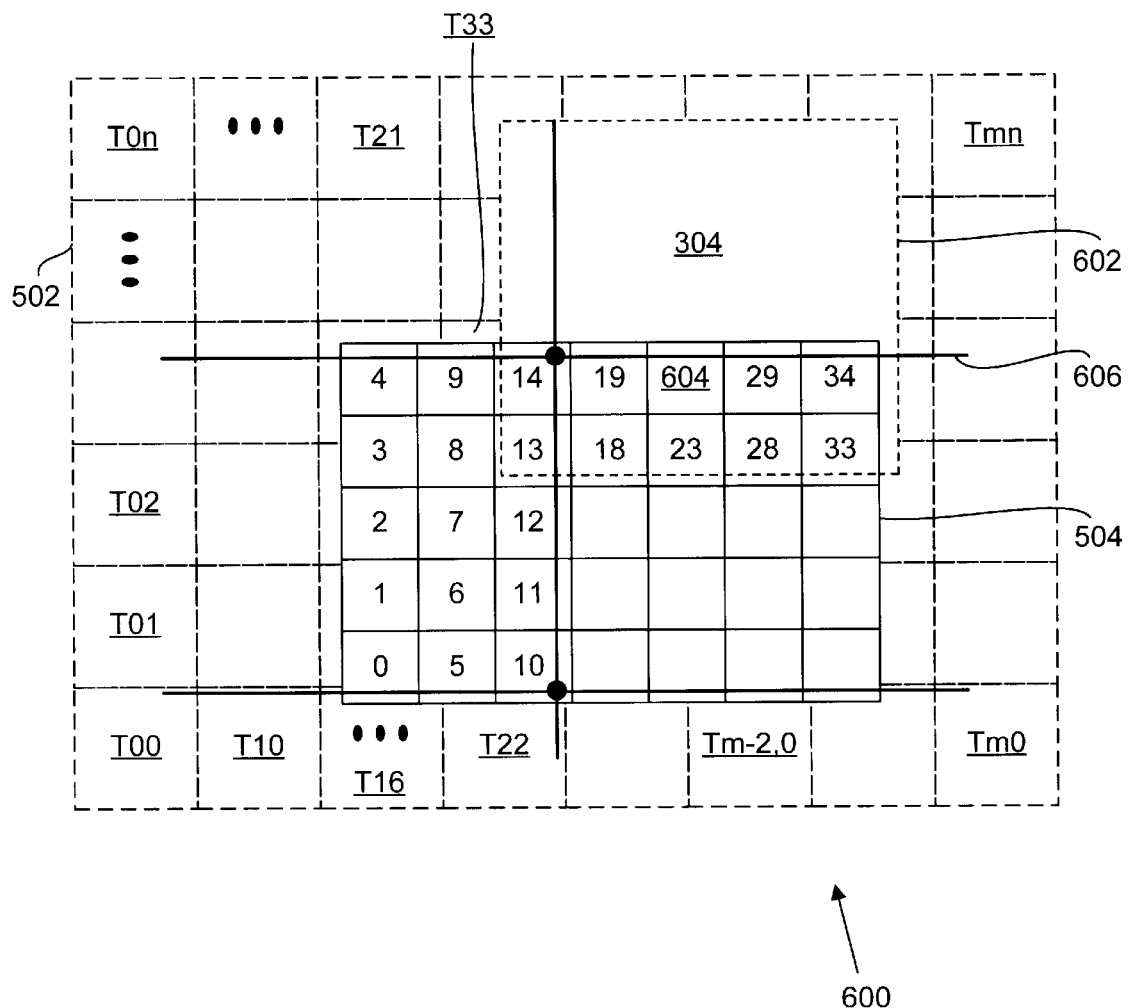
FIG. 6 shows the array of bins of FIG. 5 with schematic representation of overlapping instances of cells.

By way of illustrating the overlap determination step 406 of the present invention, refer to FIGS. 5 and 6 where a top cell 502 is divided into a top-level array of bins T00 to Tmn. The first bin, identified as bin T00, is the lower left-most bin of the array while the last bin, identified as bin Tmn, is the upper right-most bin of the array. One skilled in the art will understand that the indicated size and the number of bins have been selected for purposes of illustration and are not intended to be to scale or indicative of a preferred number of bins comprising the top level array. Also shown in FIG. 5 is a cell instance 504 that is a child cell to parent cell 502. Cell instance 504 is divided into bins 0–34.

Once the linked hierarchical list 100 is generated, hierarchical manager 310 has access to an attribute file that describes the layout data in the following manner. Each parent cell (e.g., cell 502) contains information as to its local geometry, the bins of its child cell instances and their placements within the parent cell. That is, the size and placement of each instance of a cell is known as are the hierarchical structure or relationship of the instances comprising the device. Local geometry is similarly identified and defined. From the above information, each parent bin, T00–Tmn, of the parent cell 502 contains a separate linked list that includes: (1) a reference to any local geometry within that parent bin; (2) the bin numbers of any cell instances (child cells) located with that parent bin.

Figure 4B:
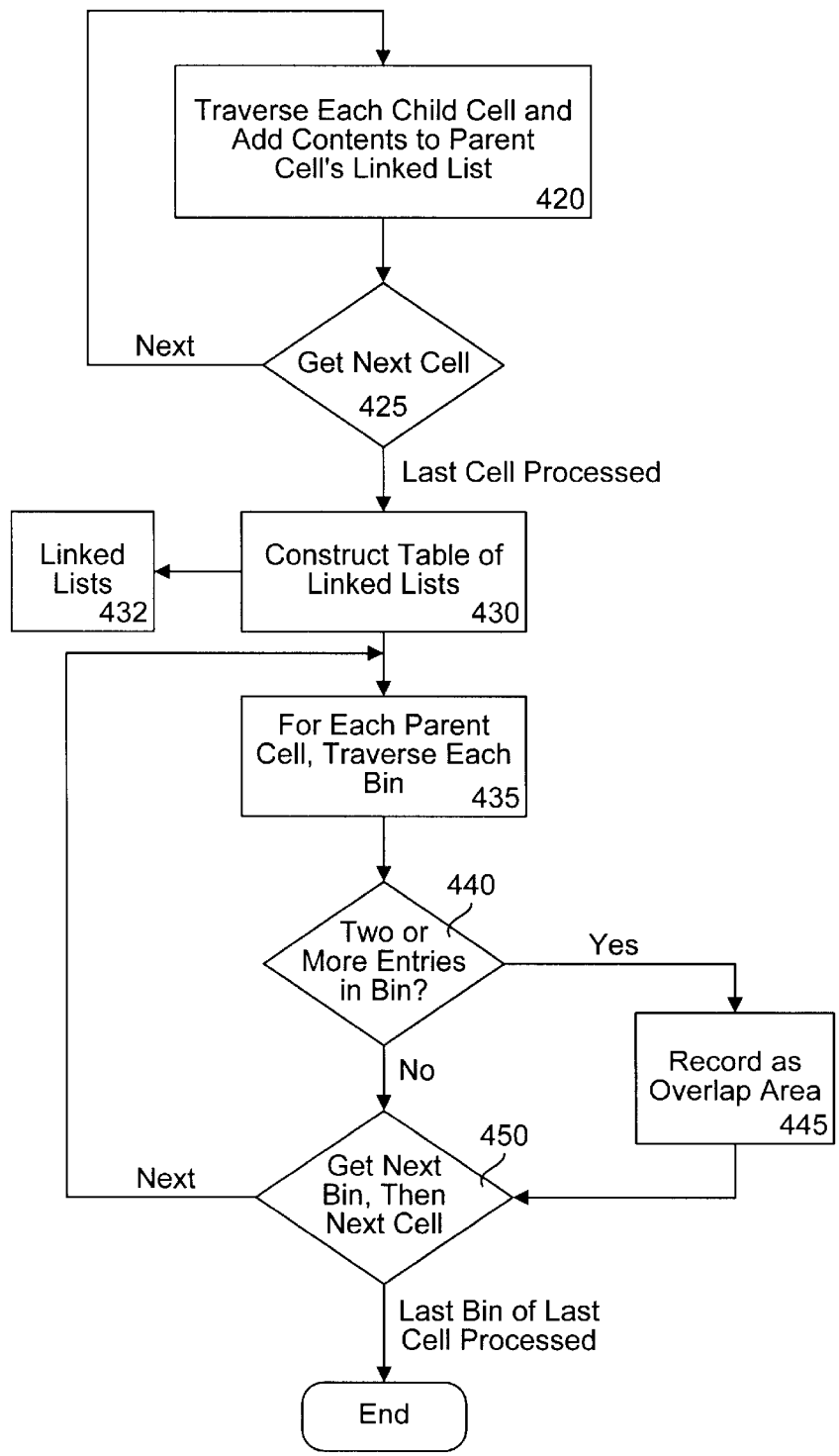
FIG. 4B illustrates a flow diagram of steps performed by the present invention for overlap area detection.

Refer to FIG. 4B which illustrates the steps of the overlap determination process 406 of the present invention in more detail. The linked list information, described above, is generated in the following manner for bins of a given parent cell. First, each child cell instance of the parent cell is traversed, bin by bin, step 420. For each child bin, the parent bin(s) in which the child bin occupies are recorded, step 425. This is done by recording, in the linked list of the parent bin, an identification of the child bin which is located in the parent bin. Specifically, in the linked list of each parent bin so recorded, the child bin number and child instance name are recorded.

At step 420, the local geometry of a parent cell is also traversed and recorded into the linked lists of the parent bins in like fashion. Therefore, at the end of the above processing, each bin of the parent cell contains an identifier of all local geometry located therein and also a list of all bins of child instances that are located therein. For instance, in the linked list for parent bin T16 (FIG. 6) identifiers of the bins 0 and 5 of instance cell 504 are stored in addition to an identifier of the local geometry 606 that passes through bin T16. In the linked list for parent bin T22 the bins 5 and 10 of instance cell 504 are stored in addition to an identifier of the local geometry 606 that passes through bin T22. If the parent cell 502 contained another child instance, then the bins of the this additional child instance would also be added to the linked lists of the parent bins.

The above process of FIG. 4B is performed for each parent cell within the hierarchical tree 100. The linked lists for each parent cell are then added together to form a linked table 432, step 430 of FIG. 4B. The linked table 432 is used by the present invention at step 404 to determine overlap areas and also to perform selective flattening of the overlap layout geometry in accordance with the present invention.

Using the linked lists 432, hierarchical manager 310 examines each bin of the top level array (step 435) in a sequential manner and determines if two or more instances of cells have a presence in the parent bin (step 440). Or, if local geometry and a cell instance have a presence in the parent pin (step 440). This can be determined by an inspection of the linked list for each parent bin. If a parent bin has two or more entries, an indication an overlap, the parent bin is recorded as having an overlap area (step 445). As shown by step 450, this process continues for each bin of the parent or top level cell.

The location of each instance of a cell can be defined by a reference sub-cell (usually the lower left coordinate of the sub-cell) or by a reference coordinate of the instance of the cell itself and by the number of local bins associated therewith. The table 432 of linked lists, for each top level bin, identifies whether portions of one or more cells reside in the top level bin. If more than one instance of a cell is identified having one or more common parent bins, the coordinates of each instance can be compared and where there are matching coordinates for each instance, the cell have overlapping regions. Accordingly, DRC 314a and LVS 314b checking is then be performed on the overlapping regions to verify conformance with the design rules.

Local geometry coordinates are similarly listed in the linked list 432. As hierarchical manager 310 examines each bin of the top level array it is possible to determine if local geometry is present in the particular bin. As discussed above, local geometry in combination with a cell instance can result in overlap conditions be detected at step 440. For instance, refer to FIG. 10. Parent cell 830 shows several bins that have a cell instance and local geometry in overlap. Bin Tb19 and Tb25 have cell instance 820a and local geometry 870 in overlap.

FIG. 6 illustrates the overlap of an instance of a cell 504 and instance of a cell 602 in overlap area 604. Overlap occurs in this illustration in the area of the integrated circuit defined by top level bins T(3,2), T(3,3) at a left boundary and extending to bins T(m-1,2) and T(m-1,3) at a right boundary. As shown, overlap area 604 coincides with local bins 13, 14, 23, 24, 28, 29, 33 and 34 of the instance of cell 504. Accordingly, hierarchical manager 310 associates with each top level bin the fact that instance of a cell 504 and instance of a cell 602 are both located in the area of the integrated circuit bounded by top level bins T(3,2), T(3,3), T(m-1,2) and T(m-1,3). The hierarchical manager 310 also associates routing coordinates defining local geometry 606 which may, for example, be a power bus or a clock bus with the appropriate top level bins. The hierarchical manager 310, as discussed above, builds a linked list 432 for each top level bin that includes all bin numbers of child instances located therein and also an identification of the local geometry stored therein. The linked list for bin T(3,3) would indicate those bins of instance 304, those bins of instance 504 and the definition of certain local geometry 606 that are stored in the tin T(3,3).

Once the linked list is properly annotated with top level bin information (or associated therewith), it is efficient in terms of computer processor and memory and I/O utilization to determine if more than one instance of a cell and/or local geometry resides within the boundary of each top-level bin. If more than one instance of a cell is present in a bin, that bin is identified as having overlapping instances and/or local geometry as shown in FIG. 4B. This method does not require any logical operations, pattern recognition, pattern matching or complicated algorithms to determine overlap area.

Rather, once the link list is fully annotated, sorting the list to determine which instances reside in common bins and counting the number of sub-bins in each bin having common coordinates is all that is required to determine where instances overlap.

SELECTIVE FLATTENING OF THE OVERLAP DATABASE

Once overlap has been identified, hierarchical checker 312 selectively flattens the hierarchical tree 100 of FIG. 1 in the areas corresponding to overlap region 604. In this manner, the entire instance need not be rechecked through the DRC 314a and LVS 314b processes merely because of the overlap. Only the geometry of the overlap region is layout verified. Advantageously, memory utilization and I/O calls are kept to a minimum since regions of each instance outside the overlap region need not be further processed during the flattening process.

Selective flattening occurs using a top down approach. As an example, hierarchical checker 312 drills down to the lowest leaf cells (for example, leaf cells 122–130) comprising instances of cells 504 and 602 in overlap region 604. The geometry of each leaf cell in overlap region 604, and any intermediate cell, is directly pushed to the overlap database without being recorded in any intermediate memory stores associated with any intermediate level. This continues until the overlap region 604 is fully flattened. The layout data is directly pushed upward into an overlap database.

Figure 4C:
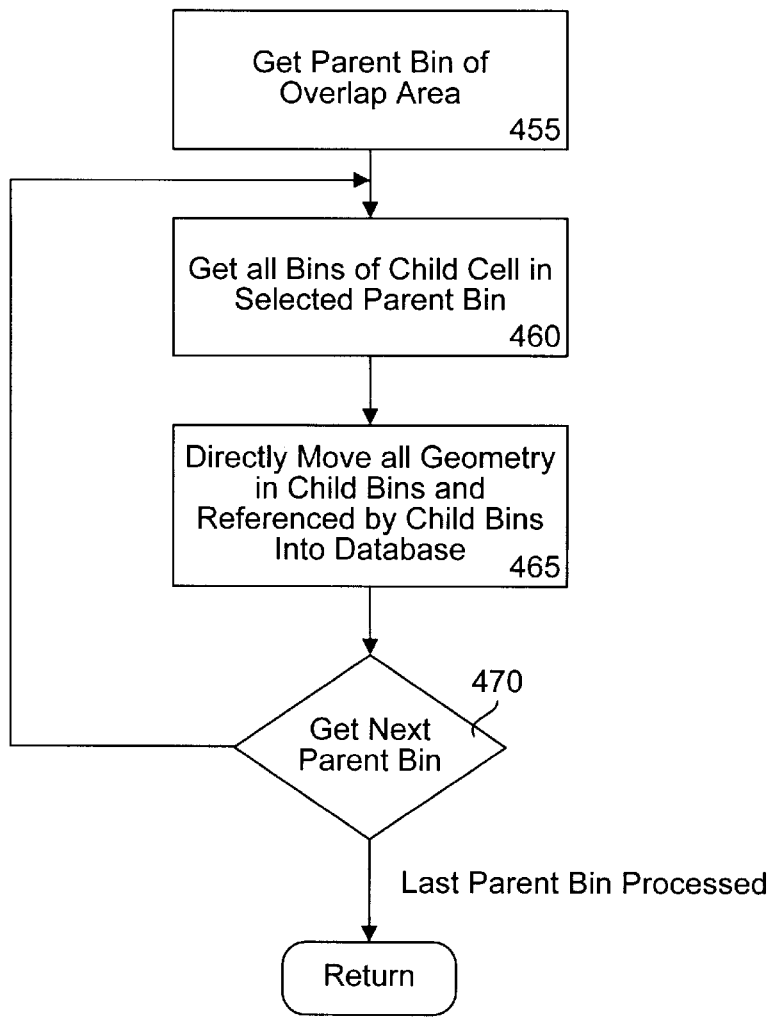
FIG. 4C illustrates a flow diagram of steps performed by the present invention for selective flattening of detected overlap areas.

FIG. 4C illustrates this in a process diagram of steps performed within process 408. A parent bin is located that has an overlap therein, step 455. All bins of the instance that reside in the parent bin are located from the parent bin's linked list. These bins of the instances are traversed down the hierarchical tree 100 and all geometry located in these bins (or reference by these bins) is directly recorded in the overlap database, step 465. No intermediate storage is used when pushing the geometry data upwards. At step 470, this process continues for all bins of the parent that have overlap areas.

Figure 11:
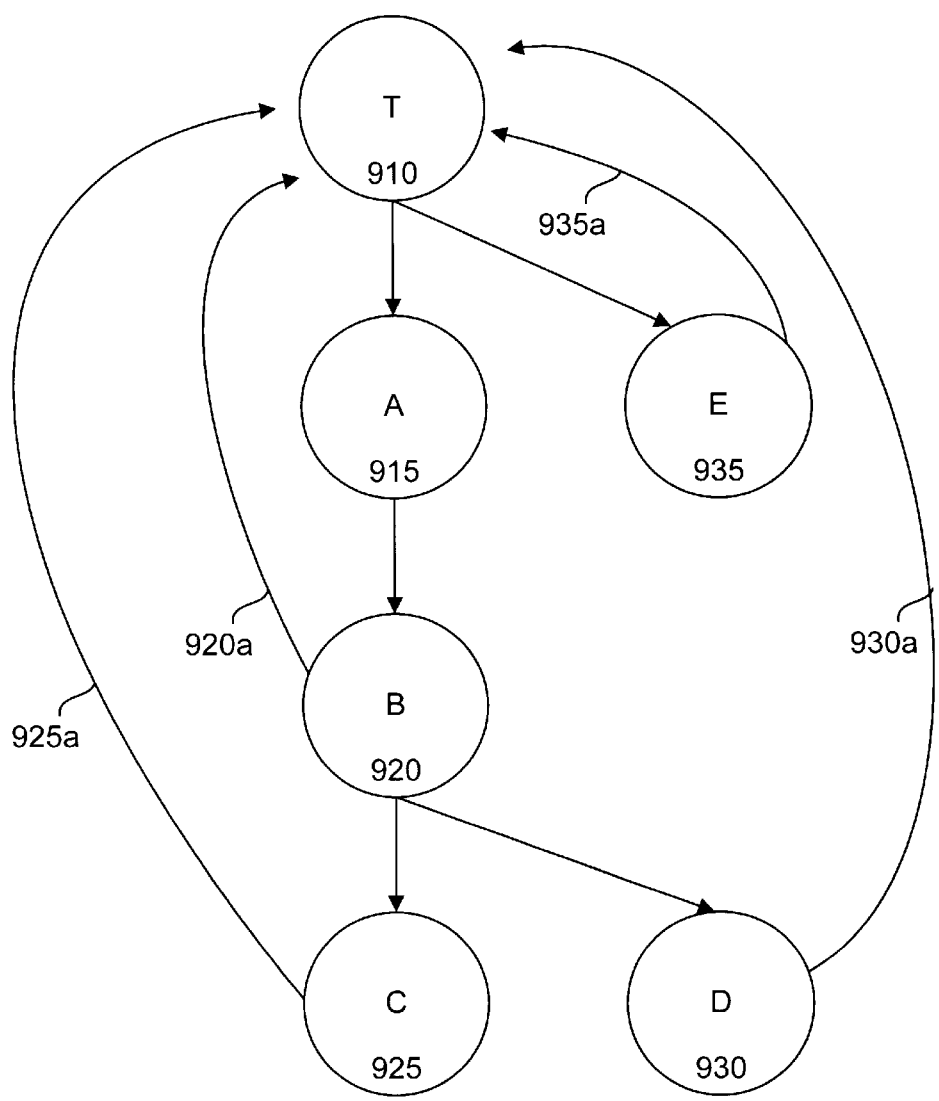
FIG. 11 is an illustration of direct selective flattening in accordance with the present invention.

For example, refer to FIG. 11 which illustrates a data flow diagram 900 of the top down selectively flattening process of the present invention. Assume cell T 910 is a parent cell containing portions of instances A 915 and E 925 that overlap within a bin, X, of cell T 910. Cell E 925 is a leaf cell. All bins of E 935 that reside in bin X of T 910 are directly moved to the overlap database as shown by path 935a. The bins of cell A 915 that reside within bin X have no local geometry but they reference a set of bins within cell B 920 and also reference some local geometry in cell B 920. This local geometry is directly pushed into the overlap database as shown by path 920a. The set of bins within cell B 920 references two leaf cells C 925 and D 930. The geometry of these cells is then directly pushed into the database as shown by paths 925a and 930a, respectively. Therefore, no intermediate storage is used to hold the geometry of the overlap area in accordance with the present invention because it is directly pushed into the overlap database.

With reference to FIG. 6 and FIG. 1, instances of cell 504 and cell 602 comprise cell 112 and cell 114, respectively, as shown in the hierarchical tree 100 of FIG. 1, leaf cells 122 and 124 are combined with the geometry of cell 112. During the selective flattening process of the present invention, cell 112 is then combined with the geometry of cell 114 at cell 106. When combined with local geometry 606 in overlap area 604, it is possible to fully represent overlap region 604. Storage requirements are minimized because no intermediate storage databases are used as the hierarchical tree 100 is traversed during the flattening process and also because only the overlap areas are flattened and not the entire cells.

When selective flattening process 408 is complete, the overlap database is then forwarded to the DRC 314a and LVS 314b checkers, as shown in FIG. 3.

Figure 7:
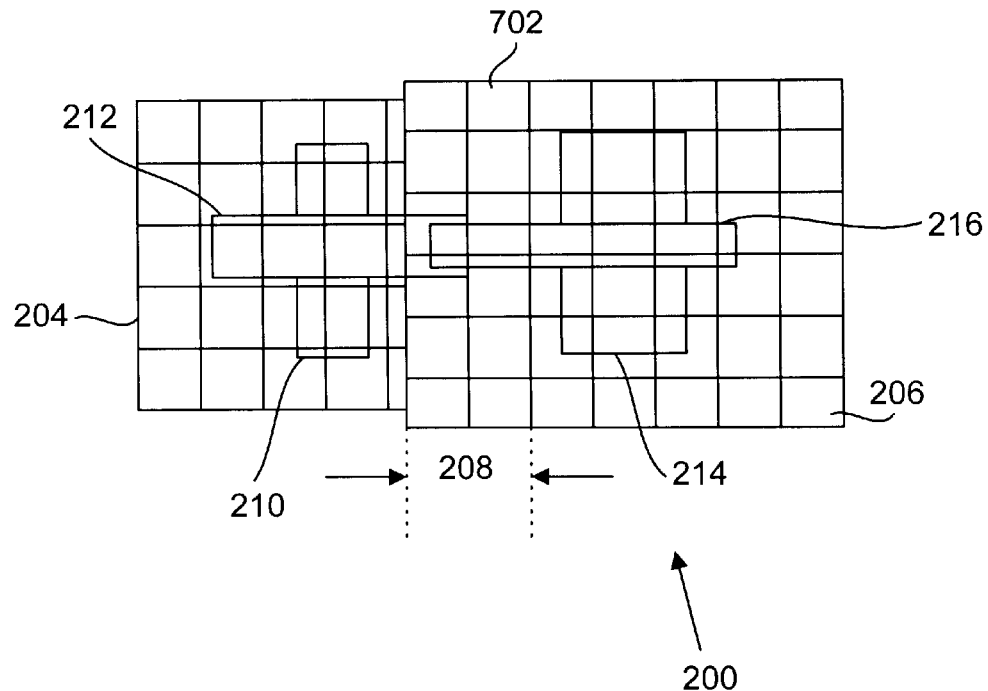
FIG. 7 illustrates that in the present invention each leaf cell can be further defined by an array of bins.

FIG. 7 illustrates that just as each bin of the top level array defines the coordinate system of the integrated circuit in which the instances of cells are placed, it is also contemplated in the present invention that each leaf cell 204 and 206 shall further be defined by an array of bins. Cells 204 and 206 contains geometry 210–216. During the selective flattening process 408, only the geometric primitives in each leaf cell the overlap region 208 are mapped in and passed to the DRC and LVS processes. That is, only the geometry within the 12 bins 702 of the overlap region 208 are flattened. Accordingly, only the minimally necessary geometry will be passed up during the flattening process rather than the entire leaf cell. It will be apparent to one skilled in the art that the flattening process may alternatively include the leaf cell bins immediately surrounding overlap region 208.

One skilled in the art will appreciate that the present invention preserves the hierarchical tree 100 through the layout verification and netlist extraction process while minimizing storage requirements in the computer system. Moreover, by preserving the hierarchical structure, modifications may be easily implemented in the files retained in the database in the event a DRC violation is detected since all file paths are retained. Also by selectively flattening instances and processing through the DRC on only the flattened portion, flattened intermediate cells (for example, cell 116) may then be replicated (or reused) without further verification of compliance with the design rules at later stages of the verification process. Since the flattened intermediate cell may be added to the cell library database 306 (FIG. 3), there is no need to rebuild the intermediate cell each time it is used. Any such reuse may further decrease the length of time to perform the DRC process. Further, the efficiency of the DRC and LVS processes are improved in terms of memory utilization, processor time, I/O calls etc., since only the flattened intermediate cell portions need be submitted to the DRC process.

While certain exemplary preferred embodiments have been described and shown in the accompanying drawings, it is to be understood that such embodiments are merely illustrative of and not restrictive on the broad invention. Further, it is to be understood that this invention shall not be limited to the specific construction and arrangements shown and described since various modifications or changes may occur to those of ordinary skill in the art without departing from the spirit and scope of the invention as claimed.

What is claimed is:

1. A computer implemented method for verifying a portion of layout data of an integrated circuit device where said layout data comprises a plurality of cells having parent-child relationships and organized according to a hierarchical tree, said method comprising the steps of:

a) defining an array of top level bins corresponding to the surface area of a top level cell of said integrated circuit wherein a parent cell can include multiple top level bins;

b) constructing a linked list for each top level bin wherein said linked list contains a listing of bins of all instances within said top level bin and any local geometry within said top level bin; and c) identifying overlap areas within said integrated circuit by searching through all link lists of said top level bins and recording top level bins having bins of two or more cell instances indicated in their corresponding linked lists; and d) performing layout verification only on layout geometries associated with said overlap areas identified in step c).

2. The method of claim 1 wherein step c) further comprises the step of identifying overlap areas within said integrated circuit by searching through all said link lists of said top level bins and recording top level bins having local geometry and a bin of at least one cell instance indicated in their corresponding linked lists.

3. The method of claim 1 wherein step d) comprises the steps of:

d1) flattening said overlap areas into an overlap database; and d2) performing layout verification on the geometries of said overlap database.

4. The method of claim 3 wherein step d2) comprises the steps of:

performing design rule checking on said geometries of said overlap database; and performing layout versus schematic checking on said geometries of said overlap database.

5. The method of claim 1 wherein said step b) comprising the steps of:
   b1) defining an array of local bins for each cell instance of said hierarchical tree;
   b2) identifying the coordinates of each of said local bins of each of said cell instances with respect to coordinates of said top level bins;
   b3) using said coordinates to record, in a linked list for a given top level bin, those local bins located within said given top level bin; and
   b4) repeating step b3) for each top level bin of said top level cell.

6. The method of claim 5 wherein said step b) further comprises the steps of:
   b5) identifying the coordinates of each local geometry of said top level cell; and
   b6) using said coordinates to record, in a linked list for a given top level bin, those local geometry located within said given top level bin; and
   b7) repeating step b6) for each top level bin of said top level cell.

7. A computer implemented method for verifying a portion of the layout data defining an integrated circuit, said method comprising the computer implemented steps of:
   a) creating a polygon database having a plurality of cells containing geometry of said layout data;
   b) creating a hierarchical tree defining parent-child relationships of said plurality of cells wherein said hierarchical tree and said plurality of cells fully describe the layout data of said integrated circuit;
   c) defining an array of top level bins corresponding to the surface area of a top level cell of said integrated circuit wherein a parent cell can include multiple top level bins;
   d) constructing a linked list for each top level bin wherein said linked list contains a listing of bins of all cell instances within said top level bin and any local geometry within said top level bin;
   e) identifying overlap areas within said integrated circuit by searching through all link lists of said top level bins and recording top level bins having bins of two or more cell instances indicated in their corresponding linked lists; and
   f) performing layout verification only on layout geometries associated with said overlap areas as identified in step e).

8. The method of claim 7 wherein step e) further comprises the step of identifying overlap areas within said integrated circuit by searching through all said link lists of said top level bins and recording top level bins having local geometry and a bin of at least one cell instance indicated in their corresponding linked lists.

9. The method of claim 7 wherein step f) comprises the steps of:
   f1) flattening said overlap areas into an overlap database; and
   f2) performing layout verification on the geometries of said overlap database.

10. The method of claim 9 wherein step f2) comprises the steps of:
   performing design rule checking on said geometries of said overlap database; and
   performing layout versus schematic checking on said geometries of said overlap database.

11. The method of claim 7 wherein said step d) comprising the steps of:
   d1) defining an array of local bins for each cell instance of said hierarchical tree;
   d2) identifying the coordinates of each of said local bins of each of said cell instances with respect to coordinates of said top level bins;
   d3) using said coordinates to record, in a linked list for a given top level bin, those local bins located within said given top level bin; and
   d4) repeating step d3) for each top level bin of said top level cell.

12. The method of claim 11 wherein said step d) further comprises the steps of:
   d5) identifying the coordinates of each local geometry of said top level cell; and
   d6) using said coordinates to record, in a linked list for a given top level bin, those local geometry located within said given top level bin; and
   d7) repeating step d6) for each top level bin of said top level cell.

13. A computer system having a processor coupled to a bus and a memory unit coupled to said bus, said memory unit containing instructions that when executed implement a method for verifying a portion of the layout data defining an integrated circuit, said method comprising the steps of:
   a) creating a polygon database within said memory unit having a plurality of cells each for containing geometry of said layout data;
   b) creating a hierarchical tree defining parent-child relationships of each of said plurality of cells wherein said hierarchical tree and said plurality of cells fully describe the layout data of said integrated circuit;
   c) defining an array of top level bins corresponding to the surface area of a top level cell of said integrated circuit wherein a parent cell can include multiple top level bins;
   d) constructing a linked list for each top level bin wherein said linked list contains a listing of bins of all instances within said top level bin and any local geometry within said top level bin; and
   e) identifying overlap areas within said integrated circuit by searching through all link lists of said top level bins and recording top level bins having bins of two or more cell instances indicated in their corresponding linked lists; and
   f) performing layout verification only on layout geometries associated with said overlap areas as identified in step e).

14. The computer system of claim 13 wherein step e) further comprises the step of identifying overlap areas within said integrated circuit by searching through all said link lists of said top level bins and recording top level bins having local geometry and a bin of at least one cell instance indicated in their corresponding linked lists.

15. The computer system of claim 13 wherein step f) comprises the steps of:
   f1) flattening said overlap areas into an overlap database stored within said memory unit; and
   f2) performing layout verification only the geometries of said overlap database.

16. The computer system of claim 15 wherein step f2) comprises the steps of:
   performing design rule checking on said geometries of said overlap database; and performing layout versus schematic checking on said geometries of said overlap database.

17. The computer system of claim 13 wherein said step d) comprising the steps of:
   d1) defining an array of local bins for each cell instance;
   d2) identifying the coordinates of each of said local bins of each of said cell instances with respect to coordinates of said top level bins of said top level cell;
   d3) using said coordinates to record, in a linked list for a given top level bin, those local bins located within said given top level bin; and
   d4) repeating step d3) for each top level bin of said top level cell.

18. The computer system of claim 17 wherein said step d) further comprises the steps of:
   d5) identifying the coordinates of each local geometry of said top level cell;
   d6) using said coordinates to record, in a linked list for a given top level bin, those local geometries located within said given top level bin; and
   d7) repeating step d6) for each top level bin of said top level cell.

* * * * *